(12) United States Patent
Sadowski (10) Patent No.: US 7,215,936 B2
(45) Date of Patent: May 8, 2007

(54) SUPER-REGENERATIVE RECEIVER INCLUDING PHASE-LOCKED LOOP

(76) Inventor: Bogdan Sadowski, 107 Littleford La., Cary, NC (US) 27519

( * ) Notice: Subject to any disclaimer, the term of this patent is extended or adjusted under 35 U.S.C. 154(b) by 505 days.

(21) Appl. No.: 10/405,269

(22) Filed: Apr. 2, 2003

(65) Prior Publication Data

US 2004/0198288 A1    Oct. 7, 2004

(51) Int. Cl.
*H04B 1/10*    (2006.01)
(52) U.S. Cl. .............. 455/215; 455/255; 455/256; 455/259; 455/250.1; 455/296
(58) Field of Classification Search .............. 455/215, 455/255, 256, 257, 258; 375/136, 324, 327
See application file for complete search history.

(56) References Cited

U.S. PATENT DOCUMENTS

| | | | |
|---|---|---|---|
| 4,995,053 A * | 2/1991 | Simpson et al. ............ 375/130 |
| 5,363,415 A * | 11/1994 | Iwasaki ...................... 375/344 |
| 5,621,756 A * | 4/1997 | Bush et al. ................. 375/219 |
| 6,035,002 A * | 3/2000 | Schleifer .................... 375/318 |
| 6,668,165 B1 * | 12/2003 | Cloutier ...................... 455/336 |
| 6,864,756 B2 * | 3/2005 | Peng .......................... 331/173 |
| 6,904,101 B1 * | 6/2005 | Tang ........................... 375/316 |

OTHER PUBLICATIONS

Joehl; et al., "A Low-Power I-GHZ Super-Regenerative Transceiver With Time-Shared PLL Control", IEEE Journal of Solid-State Circuits, vol. 36, No. 7, Jul. 2001, pp. 1025-1031.

* cited by examiner

*Primary Examiner*—Quochien B. Vuong
*Assistant Examiner*—Richard Chan (57) ABSTRACT

An improved low-cost super-regenerative receiver includes sampling phase-locked loop. Phase sampling is controlled by the quench signal (264). In the preferred embodiment, logic state HIGH to logic state LOW transition of the quench signal (264) defines the timing for the event of sampling. While the quench signal (264) is in logic state HIGH, a quenched oscillator is being turned ON and the oscillation amplitude builds-up until a steady-state level is reached. When the oscillator is turned OFF, effective quality factor of an electronically tunable resonator (206) is reduced, by increasing losses in the circuit, thus to ensure aperiodic (non-oscillatory) decay. The resonator's charge—an energy stored on internal reactive components of the resonator (206), which existed at the instant of turning the oscillations OFF, is transferred during precisely defined period of time to the charge holding capacitor (404) of a charge transfer circuit (216). Charge is stored on the charge holding capacitor (404), which is also part of a loop filter, until the described here charge transfer cycle is repeated again. A frequency control signal (268) at the output of the loop filter sets the frequency of the oscillation for the duration of the succeeding oscillator ON time.

7 Claims, 9 Drawing Sheets

SUPER-REGENERATIVE RECEIVER INCLUDING PHASE-LOCKED LOOP

FIELD OF THE INVENTION

This invention relates to electronic circuits, and more particularly to super-regenerative radio receivers.

BACKGROUND OF THE INVENTION

Figure 1:
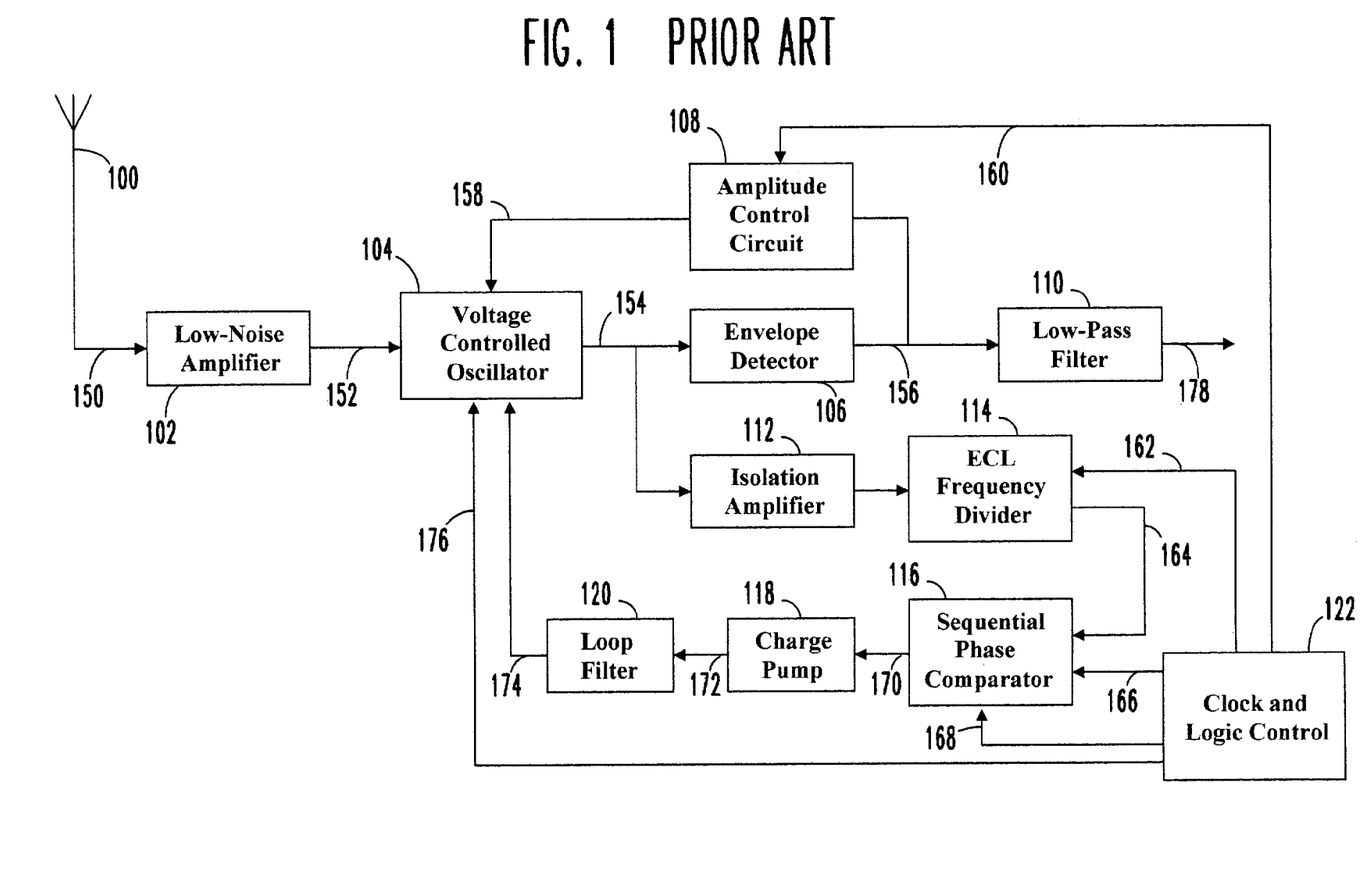
FIG. 1 is a block diagram of a prior art super-regenerative receiver.

Super-regenerative receivers are widely used in variety of applications including low-power short-range RF links. Such applications require low-cost receiver with extremely low power consumption. Super-regenerative receiver is suitable for such applications due to its simplicity and relatively good sensitivity. Frequency instability is well known disadvantage of super-regenerative receiver. Therefore, phase-locked loop has been suggested as a means for precise frequency stabilization. One such super-regenerative receiver design is described in Norbert Joehl, et al. "A Low-Power 1-GHz Super-Regenerative Transceiver with Time-Shared PLL Control" IEEE Journal of Solid-State Circuits, vol. 36, No.7, July 2001, which is incorporated here by reference. At least three additional blocks are required (ECL frequency divider, sequential phase comparator and charge pump) for such super-regenerative receiver configuration; thus the cost of receiver is increased. FIG. 1 is a block diagram of such prior art super-regenerative receiver.

Referring now to FIG. 1, a prior art super-regenerative receiver includes a voltage-controlled oscillator (VCO) 104 which is pulsed ON and OFF (quenched) by a quench signal 176 and is responsive to both frequency control signal 174 and amplitude control signal 158. Low-noise amplifier 102, which amplifies received RF input signal 150 to produce amplified RF signal 152, is connected between antenna 100 (or other equivalent source of RF input signal) and voltage-controlled oscillator 104. Low-noise-amplifier 102 also provides reverse isolation to the antenna, thus minimizing the re-radiation of the receiver's own oscillator energy and preventing interference to other receivers in the vicinity. An oscillator output signal 154 is applied to input of an envelope detector 106 to produce envelope detector output signal 156. Envelope detector output signal 156 is filtered by a low-pass filter 110 to obtain amplitude demodulated output signal 178 which is proportional to the received RF input signal amplitude. Envelope detector output signal 156 is also applied to an amplitude control circuit 108 to produce the amplitude control signal 158, thus performing an automatic oscillator's amplitude level control function (in similar way to an automatic gain control function in a typical super-heterodyne receiver), Amplitude control circuit 108 is responsive to an ACL enable signal 160 which is produced by clock and logic control 122. The oscillator output signal 154 is also applied to input of fixed ratio ECL frequency divider 114 via isolation amplifier 112 (which is inserted between output of voltage controlled oscillator 104 and input of ECL frequency divider 114). ECL frequency divider 114 is enabled by ECL frequency divider enable signal 162 produced by the clock and logic control 122. ECL frequency divider output signal 164 is applied to one of the inputs of a sequential phase comparator 116. Reference frequency signal 166, produced by the clock and logic control 122, is applied to the second input of the sequential phase comparator 116. Sequential phase comparator 116 is enabled by sequential phase comparator enable signal 168, which is produced by the clock and logic control 122. Sequential phase comparator 116 detects phase difference (phase error) between the ECL frequency divider output signal 164 and the reference frequency signal 166. Sequential phase comparator output signal 170 controls operation of a charge pump 118. Charge pump 118 is employed to produce an error signal 172 for the feedback path of the phase-locked loop. Loop filter 120 (in form of at least charge holding capacitor) filters the error signal 172 to produce a frequency control signal 174 (which is applied to frequency control input of the voltage-controlled oscillator 104). Phase-locked loop is enabled only while the quench signal 176 is in logic HIGH state (ON time). When the quench signal 176 is in logic LOW state (OFF time), oscillations are quenched and the voltage at frequency control input of the voltage-controlled oscillator 104 is memorized by the charge holding capacitor of the loop filter 120. During the ON time, phase-locked loop compensates for phase error created during the last OFF time. When turning power on to the circuit, phase-locked loop has to first run in continuous mode until initial frequency acquisition is achieved. That is not desired in certain applications, where power consumption is of concern, and thus it limits the usability of such approach. Addition of the frequency divider, the sequential phase comparator and the charge pump increases complexity, size and cost of the circuit. Since the power consumption of the ECL frequency divider increases with frequency, such approach does not assure the minimal power consumption of the receiver for higher frequencies such as microwaves. Current state of the technology also imposes upper frequency limit where the ECL frequency divider operates reliably.

SUMMARY OF THE INVENTION

Accordingly, it is an object of the present invention to provide low-complexity and low-cost super-regenerative receiver with improved frequency stability. Another objects and advantages of the present invention are:

(a) to provide frequency stabilization by means of a sampling phase-locked loop circuit which utilizes existing components of the typical super-regenerative receiver and requires minimal number of additional components;

(b) to provide frequency stabilization circuit (and method) which does not require continuous operation of the phase-locked loop nor the super-regenerative receiver;

(c) to provide the method of frequency stabilization which minimizes the power consumption of such super-regenerative receiver;

(d) to provide the circuit (and method) stabilizing operating frequency of the super-regenerative receiver which is applicable to higher operating frequencies (such as microwaves) and does not unduly increase the power consumption of such super-regenerative receiver.

Briefly, the foregoing and other objects are achieved by providing new super-regenerative receiver which includes the sampling phase-locked loop circuitry based on the blocks of conventional super-regenerative receiver. More specifically, when the oscillator is turned OFF, effective quality factor of oscillator's resonator is reduced by externally increasing losses in the circuit in order to ensure aperiodic (non-oscillatory) decay. Oscillator's signal carries the information about the phase of oscillation at the instant of turning OFF. During the time of aperiodic decay (when the oscillator is turned OFF), resonator's charge (energy stored on resonator's internal reactive components), which existed at the instant of turning oscillation OFF, is transferred (during precisely defined period of time) to the charge holding capacitor inside the loop filter. Charge is stored on the loop filter's internal charge holding capacitor until the described here charge transfer cycle is repeated again. Voltage from the output of the loop filter (frequency control signal) sets the operating frequency of the oscillator during ON time. If the phase of the quench signal and the charge transfer time are both kept constant (and the received signal does not change its phase), oscillation phase (and frequency) remains constant as well. Since the event of turning the oscillation OFF (controlled by the quench signal) occurs repeatedly, with precise frequency of occurrence (defined by the frequency stability of clock oscillator), any phase change of the oscillator signal will produce initial condition change for the aperiodic decay. Thus, the phase change of the oscillator signal (sampled at the instant of turning the oscillation OFF) will produce change in the charge stored on loop filter's internal charge holding capacitor, resulting in the correction of the phase of the oscillator signal for the next ON time. Thus, sampling phase feedback mechanism is achieved, stabilizing the operating frequency of the oscillator, which does not require continuous-time operation of the oscillator. Sampling phase-locked loop circuit, described here, does not require additional frequency divider, thus the power consumption is kept minimal for higher operating frequencies, such as microwaves. Method of achieving frequency stability, according to the invention, utilizes components which are already building blocks of the typical, conventional, super-regenerative receiver. Thus, the phase-locked loop circuit according to the invention does not unduly increase the cost and complexity of the super-regenerative receiver.

DESCRIPTION OF THE DRAWINGS

FIG. 8 depicts simplified equivalent circuit diagrams for the oscillator, of the super-regenerative receiver according to the present invention, during ON time (FIG. 8A) and OFF time (FIG. 8B).

REFERENCE NUMERALS IN DRAWINGS

100—antenna
102—low-noise amplifier
104—voltage-controlled oscillator
106—envelope detector
108—amplitude control circuit
110—low-pass filter
112—isolation amplifier
114—ECL frequency divider
116—sequential phase detector
118—charge pump
120—loop filter
122—clock and logic control
150—RF input signal
152—amplified RF signal
154—oscillator output signal
156—envelope detector output signal
158 amplitude control signal
160 ACL enable signal
162—ECL frequency divider enable signal
164—ECL frequency divider output signal
166—reference frequency signal
168—sequential phase comparator enable signal
170—sequential phase comparator output signal
172—error signal
174—frequency control signal
176—quench signal
178—amplitude demodulated output signal
200—antenna
202—low-noise amplifier
204—oscillator active circuit
206—electronically tunable resonator
208—power detecting circuit
210—amplitude control circuit
212—low-pass filter
214—clock and logic control
216—charge transfer circuit
218—low-pass filter
250—RF input signal
252—amplified RF signal
254—resonator signal
256—oscillator output signal
258—power detection signal
260—amplitude control signal
262—clock signal
264—quench signal
266—charge transfer enable signal
268—frequency control signal
270—frequency demodulated output signal
272—amplitude demodulated output signal
300—bias ramping circuit
302—analog switch
304—negative resistance circuit
306—analog switch
350—supply voltage
352—bias ramping signal
354—resonator losses compensation signal
400—analog switch
402—stabilizing resistor
404—charge holding capacitor
406—resistor
408—capacitor
500—crystal oscillator
502—frequency divider
504—logic inverter
506—logic NAND gate
508—channel selection logic control
510—charge transfer time digital counter
512—stand-by time R-S latch
514—logic NOR gate
550—transfer time value programming signals
552—transfer time counter's count enable signal
554—inverted quench signal
556—transfer time counter's output signal
558—stand-by time signal
560—inverted stand-by time signal
600—reference voltage source 602—low-pass filter
604—voltage comparator
650—reference voltage
652—signal strength voltage
700—short delay value programming device
702—long delay value programming device
704—digital multiplexer
706—delay time digital counter
708—logic NAND gate
710—receiving time R-S latch
712—bias ramping value programming device
714—bias ramping time digital counter
716—ramping time R-S latch
718—analog switch
720—bias ramping resistor
722—analog switch
724—bias ramping capacitor
750—short delay value programming signals
752—long delay value programming signals
754—delay value programming signals
756—NAND gate's output signal
758—delay time counter's output signal
760—receiving time signal
762—receiving time inverted signal
764—ramping time value programming signals
766—ramping time counter's output signal
768—bias ramping enable signal
770—inverted bias ramping enable signal
800—resonator's equivalent series inductor
802—resonator's equivalent series resistor
804—resonator's equivalent series capacitor
806—equivalent negative resistance of the oscillator active circuit
850—resonator's current

DETAILED DESCRIPTION OF THE INVENTION

Preferred embodiments of the present invention will now be described in details, with reference to the accompanying drawings. This invention may, however, be embodied in many different forms and should not be construed as limited to the embodiments set forth herein. Rather, these embodiments are provided so that the disclosure will be thorough and complete, and will fully convey the scope of the invention to those skilled in the art.

Figure 2:
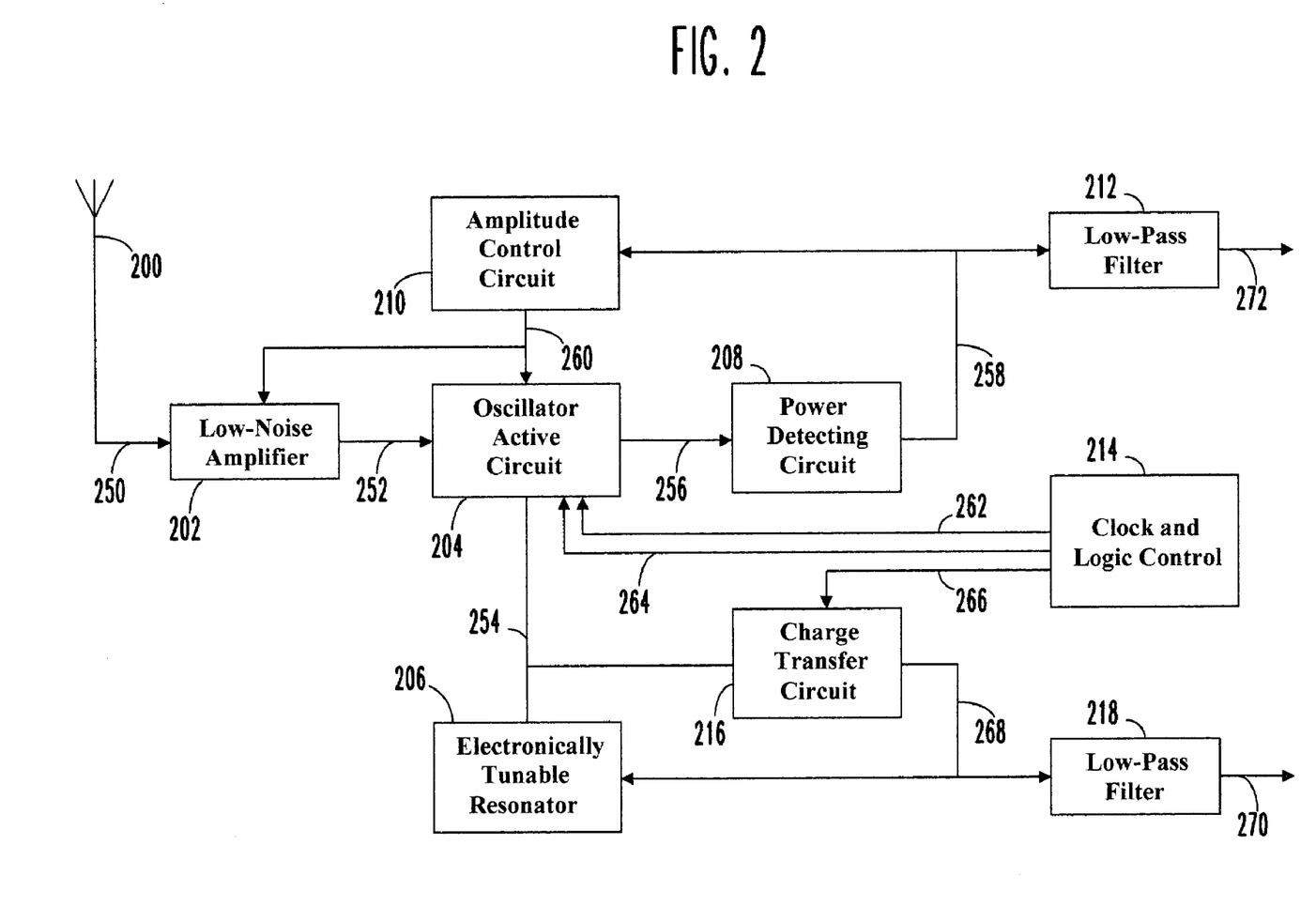
FIG. 2 is a block diagram of a super-regenerative receiver according to the present invention.

Referring now to FIG. 2, preferred embodiment of the super-regenerative receiver, according to the invention, includes an electronically tunable resonator 206 which is responsive to resonator signal 254 and frequency control signal 268. The configuration of the electronically tunable resonator 206 is such as the resonator can be represented by equivalent series resonant circuit (therefore the resonator may include phasing transmission line to move the impedance reference plane). Actual implementation of the electronically tunable resonator 206 depends on the technology used and the frequency of operation. In the preferred embodiment lumped components, such as inductor and variable capacitance diode are used. Other types of resonators, such as tunable cavity resonator or dielectric resonator, can be used for the embodiment intended for higher operating frequencies (such as microwaves). The design of the electronically tunable resonator 206 and individual components thereof are well known to those having skill in the art and need not to be described further herein.

An oscillator active circuit 204 is connected, via resonator signal 254, to the electronically tunable resonator 206 to provide negative resistance, thus to compensate the losses in the resonator. The electronically tunable resonator 206 and the oscillator active circuit 204 form together configuration of a voltage-controlled oscillator. An oscillator active circuit 204 is responsive to amplified RF signal 252. Low-noise amplifier 202 is connected between antenna 200 (or other equivalent source of RF input signal 250) and the oscillator active circuit 204.

The low-noise amplifier 202 amplifies RF input signal 250 to produce amplified RF signal 252. The low-noise amplifier 202 also provides reverse isolation to the antenna, thus preventing re-radiation of the receiver's oscillator energy and interference to other receivers in vicinity. The low-noise amplifier 202, in the preferred embodiment, is of cascode configuration, thus assuming high reverse isolation to the antenna. It is understood however, that the low-noise amplifier 202 may be designed in different configurations, as long as the high reverse attenuation and low noise figure are achieved. Low-noise amplifier 202 is responsive to amplitude control signal 260, which controls the gain of the amplifier. The amplitude control signal 260 is also connected to the oscillator active circuit 204.

The oscillator active circuit 204 is responsive to quench signal 264 and clock signal 262, both being produced by clock and logic control 214. Oscillator output signal 256 is applied to the input of a power detecting circuit 208 to produce power detection signal 258. The power detection signal 258 is filtered (integrated) by low-pass filter 212 to obtain an amplitude demodulated output signal 272 which is proportional to the amplitude of the RF input signal 250. The power detection signal 258 is also applied to amplitude control circuit 210 to produce the amplitude control signal 260. Charge transfer circuit 216 is responsive to the resonator signal 254 to produce the frequency control signal 268. The charge transfer circuit 216 is also responsive to charge transfer enable signal 266. Low-pass filter 218 filters the frequency control signal 268 to obtain frequency demodulated output signal 270.

Figure 3:
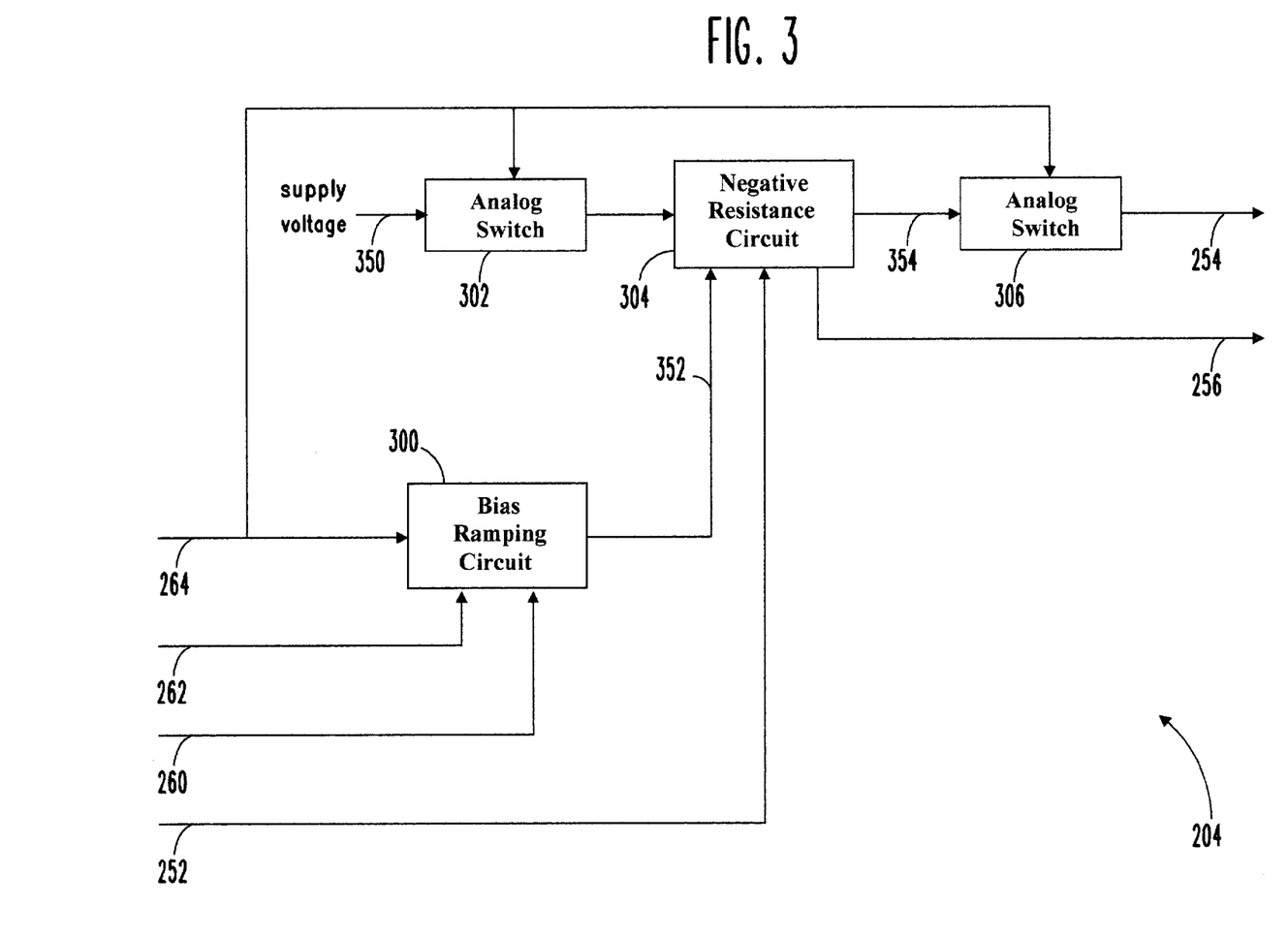
FIG. 3 depicts the preferred embodiment of the oscillator active circuit.

Referring now to FIG. 3, preferred embodiment of the oscillator active circuit 204, according to the invention, includes a bias ramping circuit 300, which is responsive to the amplitude control signal 260, the clock signal 262 and the quench signal 264, to produce a bias ramping signal 352. Negative resistance circuit 304 is responsive to the bias ramping signal 352 and the amplified RF signal 252, to produce the oscillator output signal 256 and resonator losses compensation signal 354. Supply voltage 350 is delivered to the negative resistance circuit 304 via analog switch 302. The analog switch 302 is enabled by the quench signal 264. Another analog switch 306, also enabled by the quench signal 264, is placed between the resonator losses compensation signal 354 and the resonator signal 254.

Figure 4:
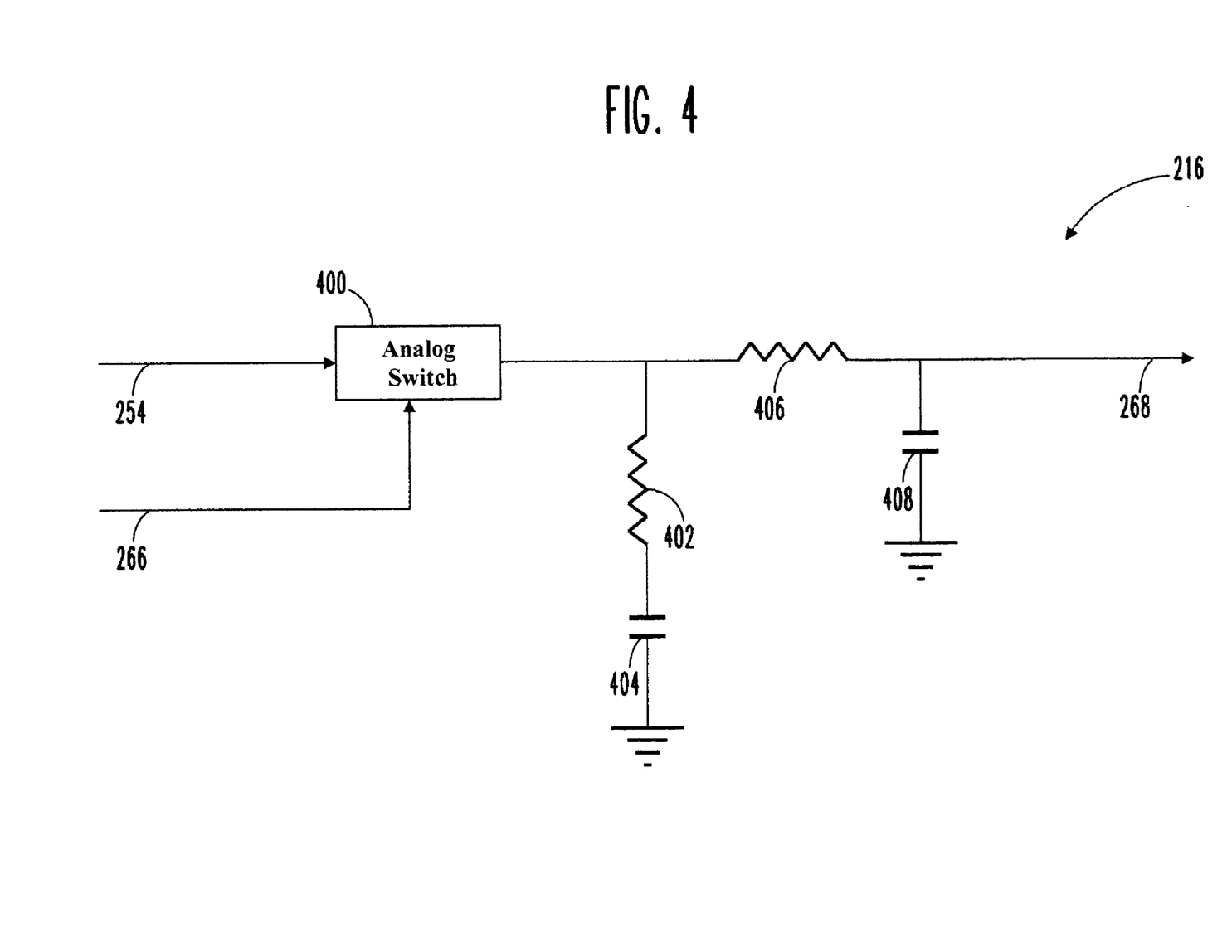
FIG. 4 depicts the preferred embodiment of the charge transfer circuit.

Referring now to FIG. 4, preferred embodiment of the charge transfer circuit 216, according to the invention, includes stabilizing resistor 402 and charge holding capacitor 404. The resonator signal 254 is delivered via analog switch 400, controlled by the charge transfer enable signal 266. Low-pass RC filter section, formed by resistor 406 and capacitor 408, further filters the signal, thus attenuating quench (sampling) frequency and other spurious sidebands from the signal, to produce the frequency control signal 268. In order to avoid rapid discharge of the charge holding capacitor 404 during time interval when the oscillator is ON, the resistance value of the resistor 406 is chosen to ensure that the discharge time constant is several times larger (ten times larger for the preferred embodiment) then the length of the ON time interval. The stabilizing resistor 402, the charge holding capacitor 404, the resistor 406 and the capacitor 408 form preferred configuration of the loop filter for the sampling phase-locked loop of the invention. The resistance value of the stabilizing resistor 402 is chosen such as the effective series resistance of the resonator when the oscillator is turned OFF, being a sum of equivalent series resistance of the electronically tunable resonator 206 and the resistance of the stabilizing resistor 402, is larger then the effective series resistance of the resonator when the oscillator is turned ON (thus the quality factor of the resonator is reduced) and is sufficient to ensure aperiodic (non-oscillatory) decay. The capacitance value of the charge holding capacitor 404 is chosen to achieve desired location of the zero for the loop filter's transfer function and to ensure the stability of the sampling phase-locked loop. The design of the loop filter for the sampling phase-locked loop is well known to those having skill in the art and need not to be described further herein.

Figure 5:
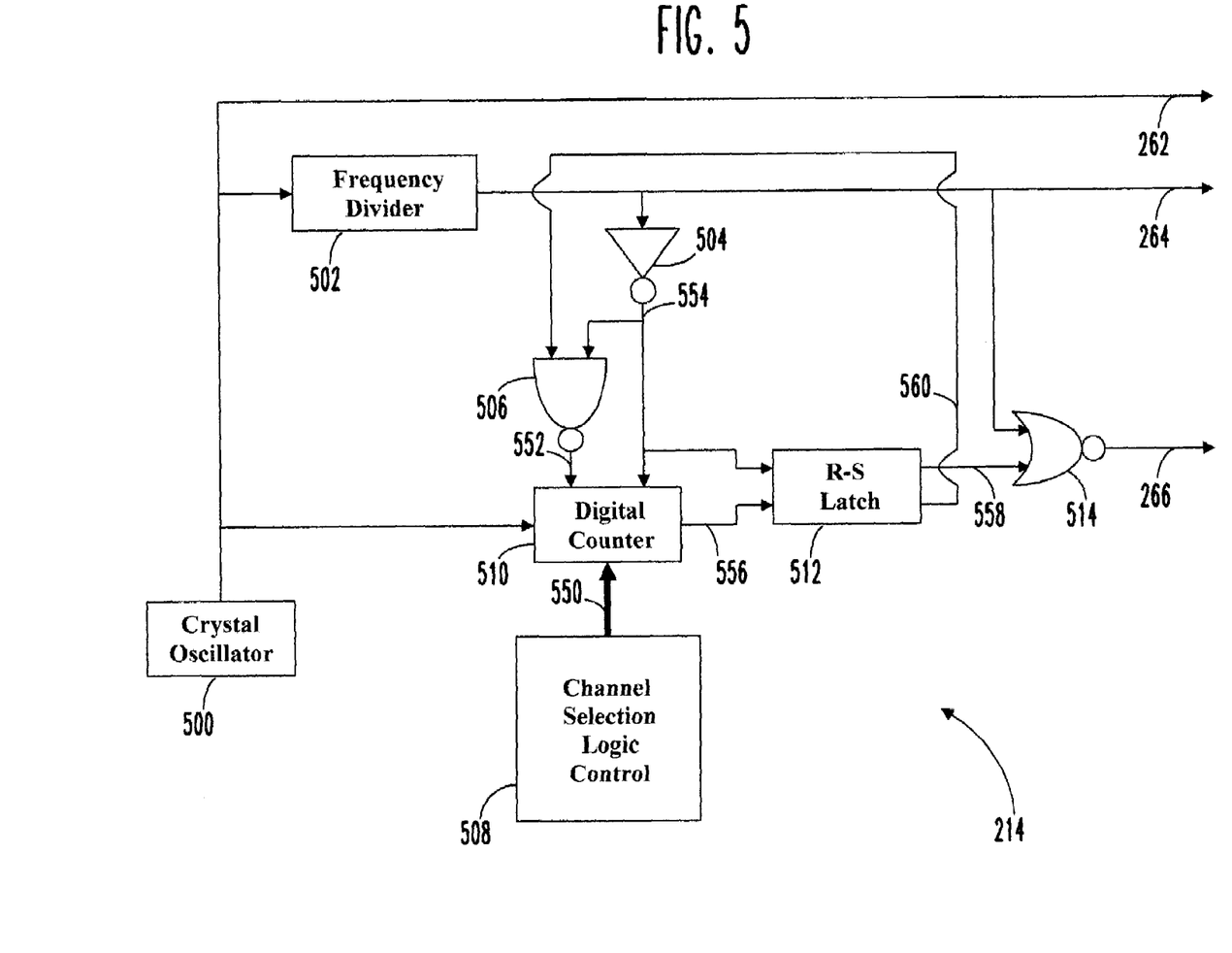
FIG. 5 depicts the preferred embodiment of the clock and logic control circuit.

Referring now to FIG. 5, preferred embodiment of the clock and logic control 214, according to the invention, includes a crystal oscillator 500, in the preferred embodiment of a Pierce oscillator circuit configuration, to generate the clock signal 262 (high frequency stability signal of rectangular waveform shape), from which all of the control signals are derived. The clock signal 262 is connected to clock input of a charge transfer time digital counter 510. The charge transfer time digital counter 510 is a reversible counter with counting down mode of operation being selected (counter's internal setup). The charge transfer time digital counter 510 is also responsive to transfer time value programming signals 550, produced by a channel selection logic control 508. In the preferred embodiment, the channel selection logic control 508 is a look-up table based on a Read-Only Memory. Upon the channel selection (performed by the user, by choosing the address of memory location), the value corresponding to selected channel, is read and the logic levels for each of the value's bits are set on the lines of parallel bus of the transfer time value programming signals 550. A frequency divider 502, a digital frequency divider in the preferred embodiment, is responsive to the clock signal 262 to produce the quench signal 264. A logic inverter 504 is responsive to the quench signal 264 to produce inverted quench signal 554. The inverted quench signal 554 is connected to load enable input of the charge transfer time digital counter 510. A logic NAND gate 506 is responsive to the inverted quench signal 554 and to inverted stand-by time signal 560 (produced by a stand-by time R-S latch 512). Output of the logic NAND gate 506 is connected to count enable input of the charge transfer time digital counter 510 (transfer time counter's count enable signal 552). The load enable and the count enable inputs of the charge transfer time digital counter 510 are of an inverted logic type (each of the inputs is activated by logic state LOW). Upon reaching value of zero (while counting down), the charge transfer time digital counter 510 generates transfer time counter's output signal 556 (inverted logic mono-pulse of carry signal). The transfer time counter's output signal 556 is connected to preset input of the stand-by time R-S latch 512. The inverted quench signal 554 is connected to clear input of the stand-by time R-S latch 512. The stand-by time R-S latch 512 is an asynchronous (static) type latch, having both inputs (clear and preset) of the inverted logic type (each of the inputs is activated by the logic state LOW). A logic NOR gate 514 is responsive to the stand-by time signal 558 and to the quench signal 264 to produce the charge transfer enable signal 266. Stand-by time signal 558 is produces by Q output of the stand-by time R-S latch 512.

The design of the individual components described above is well known to those having skill in the art and need not to be described further herein.

Figure 6:
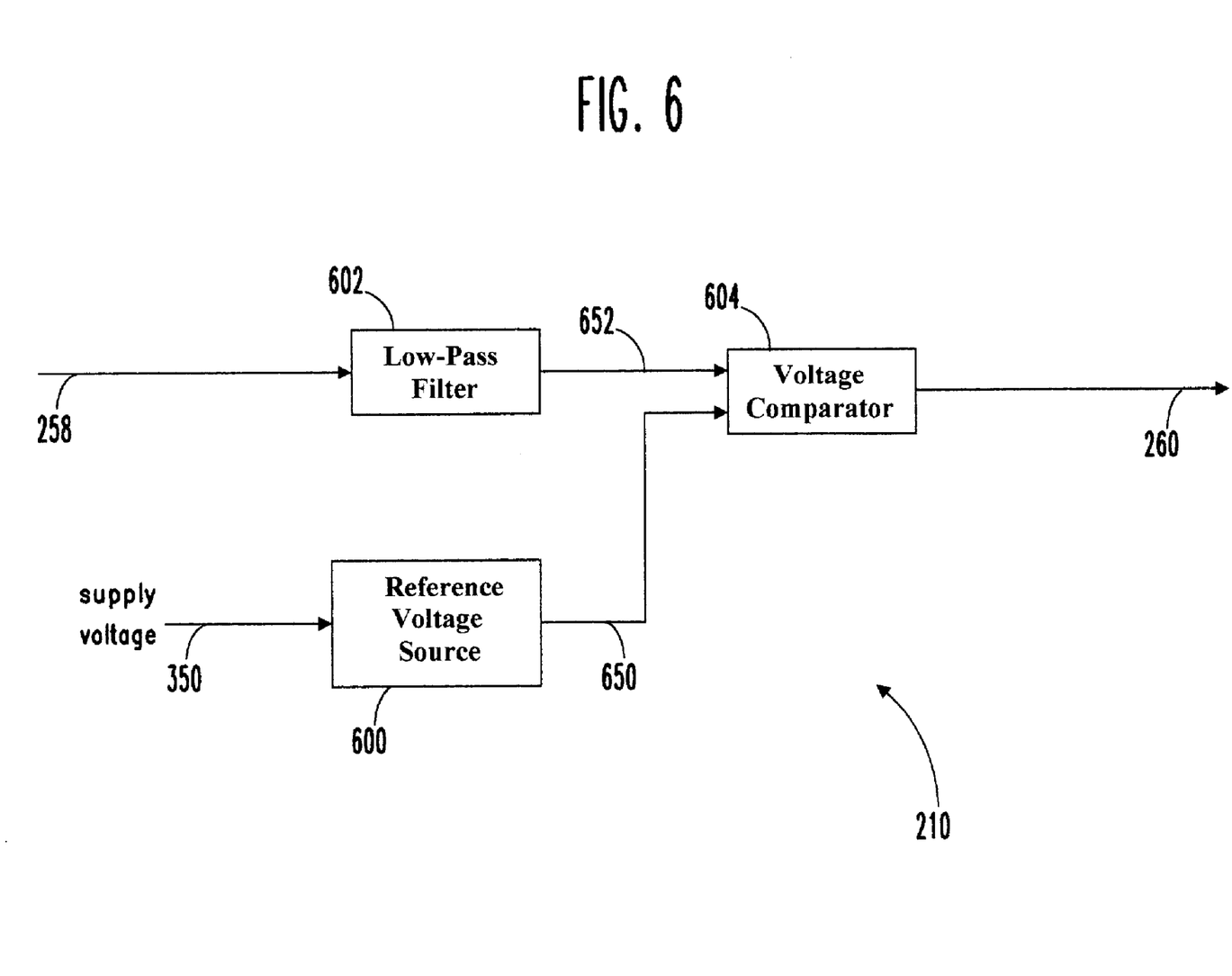
FIG. 6 depicts the preferred embodiment of the amplitude control circuit.

Referring now to FIG. 6, preferred embodiment of the amplitude control circuit 210, according to the invention, include a reference voltage source 600, which is responsive to the supply voltage 350 to generate reference voltage 650. The amplitude control circuit 210 also includes low-pass filter 602, which is responsive to the power detection signal 258 to integrate it, thus to produce signal strength voltage 652. A voltage comparator 604 is responsive to the signal strength voltage 652 and the reference voltage 650 to produce the amplitude control signal 260 (having two voltage levels compatible with the voltage levels of the logic LOW and logic HIGH states). The design of the individual components described above is well known to those having skill in the art and need not to be described further herein.

Figure 7:
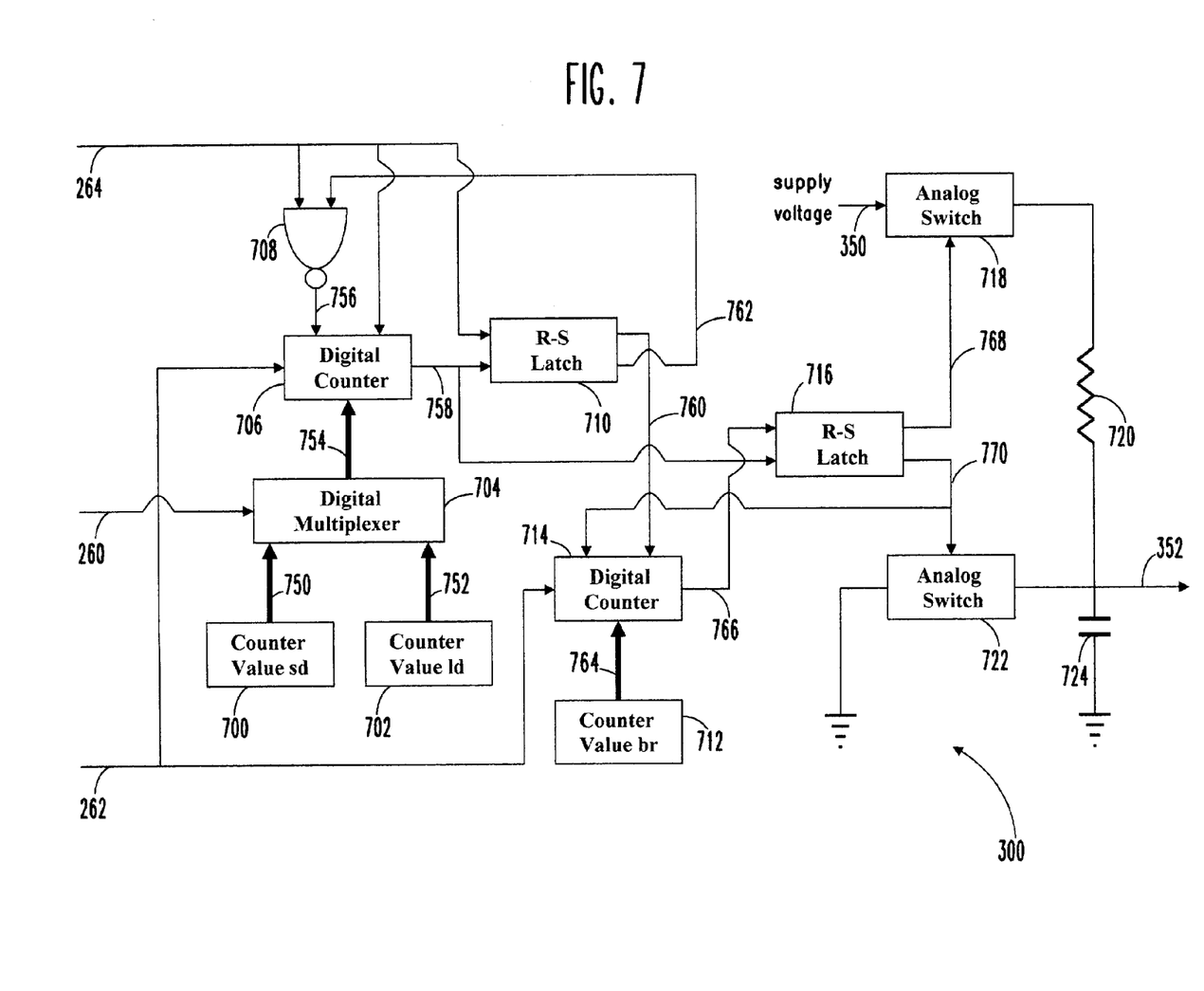
FIG. 7 depicts the preferred embodiment of the bias ramping circuit.

Referring now to FIG. 7, preferred embodiment of the bias ramping circuit 300, according to the invention, includes a delay time digital counter 706, which is responsive to the clock signal 262. The delay time digital counter 706 is reversible counter with counting down mode of operation being selected (counter's internal setup). The quench signal 264 is connected to load enable input of the delay time digital counter 706. The load enable input of the delay time digital counter 706 is of the inverted logic type (the input is activated by the logic state LOW). The delay time digital counter 706 is also responsive to delay value programming signals 754. A digital multiplexer 704 is responsive to the amplitude control signal 260. When the amplitude control signal 260 is in its LOW state, the digital multiplexer 704 connects short delay value programming signals 750 to programming inputs of the delay time digital counter 706 (via lines of the delay value programming signals 754). Thus, the value stored in a short delay value programming device 700 is loaded into the delay time digital counter 706 (in the preferred embodiment, delay value is loaded to the counter via parallel bus). In the preferred embodiment, the short delay value programming device 700 is an array of switches (allowing easy re-programming in order to optimize the receiver's performance). It is however understood, that other embodiments are possible, for example the embodiment using diode matrix. Such embodiments are considered being within the scope of the invention. When the amplitude control signal 260 is in its HIGH state, the digital multiplexer 704 connects long delay value programming signals 752 to the programming inputs of the delay time digital counter 706 (via the lines of the delay value programming signals 754). Thus, the value stored in a long delay value programming device 702 is loaded into the delay time digital counter 706. In the preferred embodiment, the long delay value programming device 702 is the array of switches (allowing easy re-programming in order to optimize the receiver's performance). It is however understood, that other embodiments are possible, for example the embodiment using diode matrix. Such embodiments are considered being within the scope of the invention. A logic NAND gate 708 is responsive to the quench signal 264 and receiving time inverted signal 762 (from a receiving time R-S latch 710), to produce NAND gate's output signal 756. The NAND gate's output signal 756 is connected to count enable input of the delay time digital counter 706. The count enable input of the delay time digital counter 706 is of the inverted logic type (the input is activated by the logic state LOW). Upon reaching value of zero (while counting down), the delay time digital counter 706 generates delay time counter's output signal 758 (inverted logic mono-pulse of carry signal). The delay time counter's output signal 758 is connected to preset input of the receiving time R-S latch 710 and to preset input of a ramping time R-S latch 716. The receiving time R-S latch 710 and the ramping time R-S latch 716 are both asynchronous (static) type latches, having both inputs (clear and preset) of the inverted logic type (each of the inputs is activated by the logic state LOW). The quench signal 264 is connected to the clear input of a receiving time R-S latch 710. Receiving time signal 760 is produces by Q output of the receiving time R-S latch 710. The receiving time signal 760 is connected to load enable input of a bias ramping time digital counter 714. The load enable input of the bias ramping time digital counter 714 is of the inverted logic type (the input is activated by the logic state LOW). The bias ramping time digital counter 714 is reversible counter with counting down mode of operation being selected (counter's internal setup). The bias ramping time digital counter 714 is responsive to the clock signal 262. The bias ramping time digital counter 714 is also responsive to ramping time value programming signals 764. The value stored in a bias ramping value programming device 712 is loaded into the bias ramping time digital counter 714 via parallel bus (of the ramping time value programming signals 764). In the preferred embodiment, the bias ramping value programming device 712 is the array of switches (allowing easy re-programming in order to optimize the receiver's performance). It is however understood, that other embodiments are possible, for example the embodiment using diode matrix. Such embodiments are considered being within the scope of the invention. Inverted bias ramping enable signal 770 (produced by the ramping time R-S latch 716) is connected to count enable input of the bias ramping time digital counter 714. The count enable input of the bias ramping time digital counter 714 is of the inverted logic type (the input is activated by the logic state LOW). Upon reaching value of zero (while counting down), the bias ramping time digital counter 714 generates ramping time counter's output signal 766 (inverted logic mono-pulse of carry signal). The ramping time counter's output signal 766 is connected to clear input of the ramping time R-S latch 716. Bias ramping enable signal 768 is produces by Q output of the ramping time R-S latch 716. Analog switch 718 is responsive to the bias ramping enable signal 768. When the bias ramping enable signal 768 is in logic state HIGH, the analog switch 718 connects the supply voltage 350 to a bias ramping capacitor 724 via a bias ramping resistor 720. While the bias ramping capacitor 724 is being charged, the voltage across the bias ramping capacitor 724 is raising, thus producing the bias ramping signal 352. Analog switch 722 is responsive to the inverted bias ramping enable signal 770 (produced by the ramping time R-S latch 716). The analog switch 722 is connected parallel to the bias ramping capacitor 724, thus discharging the bias ramping capacitor 724 when the inverted bias ramping enable signal 770 is in logic state HIGH (to prepare the bias ramping capacitor 724 for the next charging cycle). The design of the individual components described above is well known to those having skill in the art and need not to be described further herein.

OPERATION OF THE INVENTION

The operation of the super-regenerative receiver is based on the principle of the variable time of oscillation amplitude build-up as a function of the level of external RF signal injected into the receiver's oscillator (frequency of which is equal to or close to the frequency of free-running oscillation). Referring now to FIG. 2, the quench signal 264, produced by the clock and logic control 214, controls the oscillator active circuit 204 to periodically produce negative resistance for the electronically tunable resonator 206 which compensates the resonator's losses, thus producing the oscillation. The oscillator active circuit 204 and the electronically tunable resonator 206 form together configuration of the voltage-controlled oscillator. Thus, the quench signal 264 periodically turns such oscillator ON and OFF. When the oscillator is turned ON, oscillation does not start immediately but after a build-up time necessary for the oscillation's amplitude to build-up. If the frequency of injected RF signal is equal or close to the frequency of free-running oscillation, increase in the level of injected RF signal results in decrease of the build-up time. If the injected RF signal bears the amplitude modulation (AM), such signal can be demodulated using the super-regenerative receiver.

RF input signal 250 (received by the antenna 200 or supplied by other source of the RF input signal) is amplified by the low-noise amplifier 202 to produce the amplified RF signal 252. The amplified RF signal 252 is the signal which is injected into the oscillator active circuit 204 (of the super-regenerative receiver according to the invention). The low-noise amplifier 202, in the preferred embodiment, is of cascode configuration, thus ensuring high reverse isolation to the antenna.

The oscillator output signal 256 is applied to the power detecting circuit 208. In the power detecting circuit 208, bursts of oscillation of variable time length (of the oscillator output signal 256) are converted into the train of pulses having variable pulse width (thus forming the power detection signal 258). Pulses are then low-pass filtered (integrated) by low-pass filter 212 (in the preferred embodiment made of passive RC sections) to obtain the amplitude demodulated output signal 272. Corner frequency of the low-pass filter 212 is chosen to match bandwidth of the amplitude modulation (AM). In the preferred embodiment, envelope detector is used as the power detecting circuit 208. It is however understood, that other embodiments are possible, for example the embodiment having oscillator's supply current sensing device to estimate the power level of the oscillator output signal 256. Such embodiments are considered being within the scope of the invention. Accordingly, the scope of the invention should not be determined by the embodiment(s) illustrated, but by the appended claims and their legal equivalents.

Gain of the low-noise amplifier 202 is lowered in the presence of strong received signal, in order to extend dynamic range of the receiver, by means of the amplitude control signal 260. The amplitude control signal 260 switches between two voltage levels corresponding to logic level LOW (when receiving weak RF input signal) and logic level HIGH (when receiving strong RF input signal). Strong (high amplitude level) input RF signal is amplified less then the input RF signal having low amplitude, thus the amplitude of the signal injected into the oscillator (the amplified RF signal 252) is kept within the limited amplitude range. The amplitude control signal 260 is produced by the amplitude control circuit 210 in response to the power detection signal 258. The amplitude control circuit 210 responds only to slow changes of the amplitude level of the RF input signal 250, while the fast changes, caused by amplitude modulation (AM) of the signal, are left un-altered thus allowing for proper AM demodulation of the signal.

Referring now to FIG. 6, the power detection signal 258 is integrated (low-pass filtered) by the low-pass filter 602 (of the amplitude control circuit 210) to estimate average strength of the RF input signal 250. In the preferred embodiment, the low-pass filter 602 is made of passive RC sections. Corner frequency of the low-pass filter 602 is chosen based on the received signal propagation conditions (such as daily signal level variation cycle or frequency of a fading) or the frequency of the amplitude variations of the source of the RF input signal 250, caused by an environmental changes (such as a temperature variation), and is lower then the bandwidth of the desired amplitude modulation (AM) of the RF input signal 250. Input and output load impedance levels of the low-pass filter 602 are chosen to ensure that the loading of the filter will yield attack and decay times matching expected attack and decay times of the radio-wave propagation variations or the signal source variations. The signal strength voltage 652, produced by the low-pass filter 602 is compared with the reference voltage 650 using the voltage comparator 604. If the signal strength voltage 652 is higher then the reference voltage 650 (produced by the reference voltage source 600), the output voltage of the voltage comparator 604 (the amplitude control signal 260) reaches voltage level corresponding with the logic state HIGH. Otherwise, the output voltage of the voltage comparator 604 (the amplitude control signal 260) maintains voltage level corresponding with the logic state LOW. The design of the individual components described above is well known to those having skill in the art and need not to be described further herein. It is however understood, that other embodiments are possible, for example the embodiment having fixed gain low-noise amplifier (which has simpler circuitry and lower cost). Such embodiment is considered being within the scope of the invention. In addition, the embodiment having no amplifier, at the RF input, is still considered being within the scope of this invention. In such embodiment, steps must be taken to prevent re-radiation of the oscillator energy via the antenna (such as, for example, passive isolator placed between the antenna 200 and the oscillator active circuit 204). Accordingly, the scope of the invention should not be determined by the embodiment(s) illustrated, but by the appended claims and their legal equivalents.

Referring now to FIG. 2, the frequency control signal 268, produced by the charge transfer circuit 216, is low-pass filtered by the low-pass filter 218 to obtain the frequency demodulated output signal 270. In the preferred embodiment, the low-pass filter 218 is made of passive RC sections. The low-pass filter 218 functions as a receive de-emphasis filter. Corner frequency of the low-pass filter 218 is chosen based on the de-emphasis requirements for the received RF input signal bearing the frequency modulation (FM), thus such signal can be properly demodulated using the super-regenerative receiver of the invention. Loop bandwidth of the sampling phase-locked loop, of the invention, is chosen to match, or to be larger then, the FM modulation bandwidth of the received RF input signal.

Figure 8A:
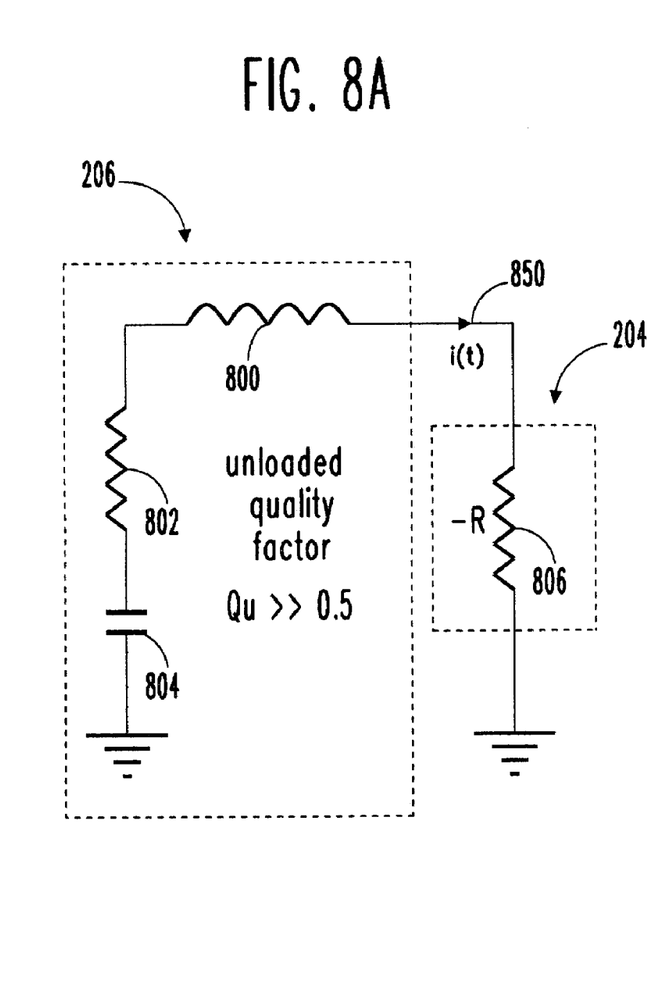
Figure 8B:
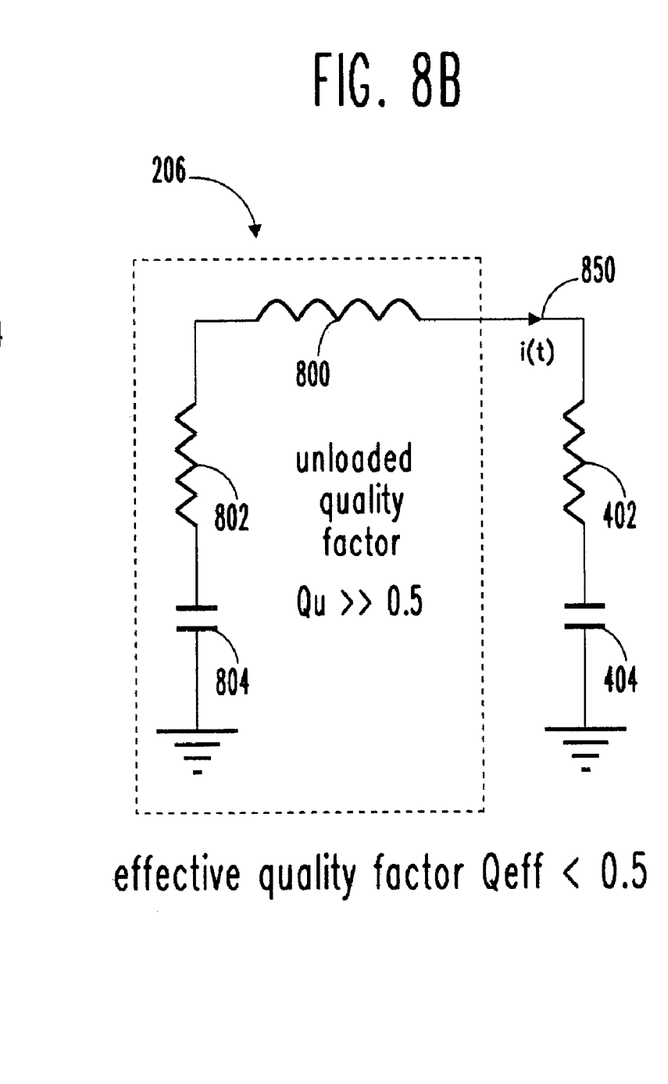
Figure 9:
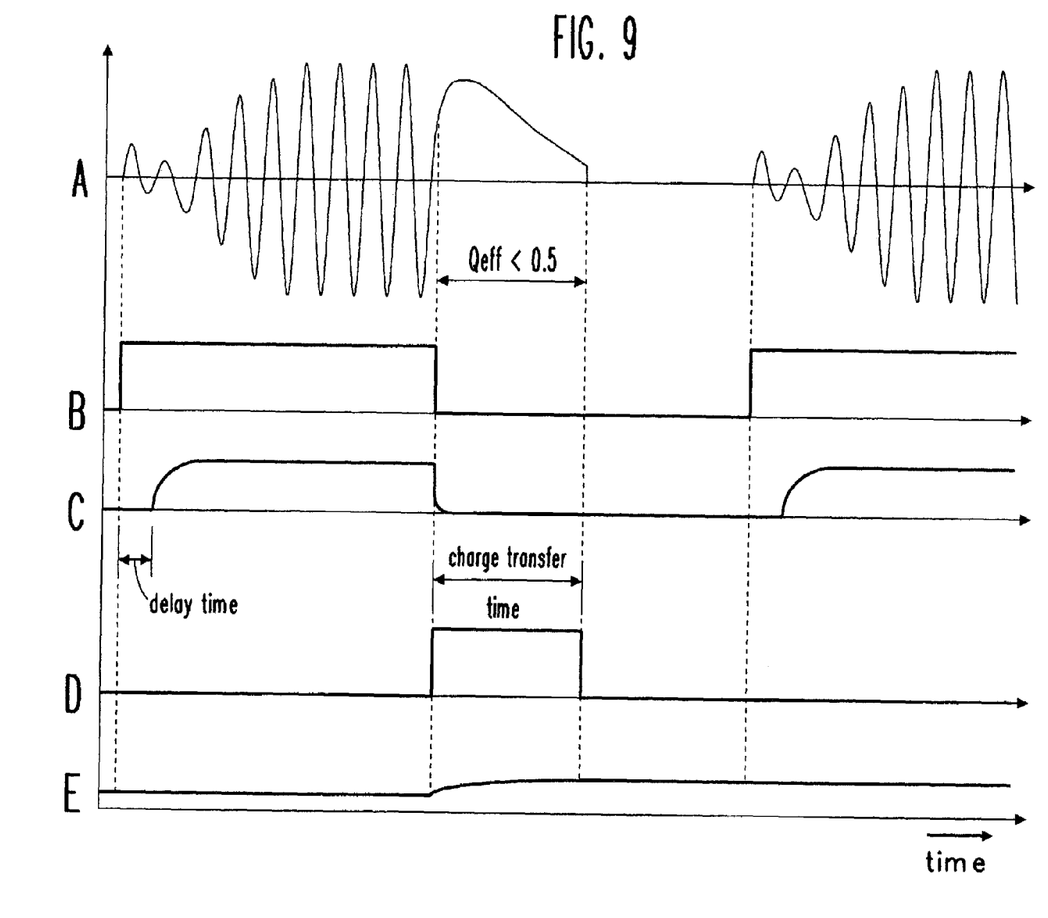
FIG. 9 is a timing diagram showing time relation between control signals and the resonator's current waveform of the super-regenerative receiver according to the present invention.

The principle of the phase (and frequency) stabilization is based on the sampling phase-locked loop concept. If the frequency of the voltage-controlled oscillator is equal to an integer multiple of the sampling frequency, the sampling of oscillator's signal, performed using narrow sampling pulses, produces samples having constant amplitude values as long as the phase of the oscillation does not change between the samples. Accordingly, change in the phase of the oscillator's signal will produce variation in amplitude values of the samples. Since the voltage-controlled oscillator of the super-regenerative receiver, according to the invention, is being turned ON and OFF periodically by the quench signal 264, the quench signal can be used to perform the sampling operation. In the preferred embodiment, logic state HIGH to logic state LOW transition of the quench signal 264 defines the timing for the event of sampling. When the voltage-controlled oscillator is ON (while the quench signal 264 is in the logic state HIGH) and is about to be turned OFF, the oscillation have already reached a steady-state level of amplitude (it is assumed that the zero reference point is shifted by the DC bias of the oscillator in such way, that the resonator's voltage is oscillating between maximum and minimum values having the same sign). The oscillator could be represented by simplified equivalent circuit as shown in FIG. 8A. The oscillator active circuit 204 is represented by equivalent negative resistance of the oscillator active circuit 806. The electronically tunable resonator 206 (shown as a fixed frequency resonator for simplicity) is represented by series connection of resonator's equivalent series inductor 800, resonator's equivalent series resistor 802 and resonator's equivalent series capacitor 804. When the oscillator is turned OFF (while the quench signal 264 is in the logic state LOW), effective quality factor (Qeff) of the resonator is reduced by connecting, in series with the resonator, the stabilizing resistor 402 and the charge holding capacitor 404 (of the charge transfer circuit 216), as shown in FIG. 8B. Thus, the losses in the resonator circuit are increased in order to ensure aperiodic (non-oscillatory) decay. The charge (due to energy stored in the electrical field), which existed at the instant of turning the oscillator OFF, is now being transferred between the resonator's equivalent series capacitor 804 and the charge holding capacitor 404. Referring now to FIG. 4, charge transfer is controlled by the charge transfer enable signal 266 (turning on the analog switch 400 for the charge transfer time interval, length of which is imposed by the receiver's operating channel frequency selection). Waveform of the resonator's current 850 (assuming one particular value of initial phase) is depicted in FIG. 9—waveform A. Referring now to FIG. 9, voltage of the quench signal 264 is shown in FIG. 9 as waveform B. At the instant when voltage of the quench signal 264 goes to logic state LOW, voltage of the charge transfer enable signal 266 goes to logic state HIGH for the charge transfer time interval, as depicted in FIG. 9 as waveform D. The charge holding capacitor 404 is being charged (for the case of the particular value of oscillation phase, as depicted in FIG. 9) by decayed resonator's current 850. As a result of increasing charge on the charge holding capacitor 404, voltage of the frequency control signal 268 is rising to a new value, as depicted in FIG. 9—waveform E, thus pre-setting the frequency of the oscillator to the desired receiver's operating channel frequency. The new voltage value of the frequency control signal 268 is held constant, or almost constant, until the next charge transfer event. Amount of voltage increase (or decrease in the case of discharging) is controlled by the length of the charge transfer time interval. Therefore, the look-up table could be derived, allowing for selection of the receiver's operating channel frequency by reading the corresponding value to be used as the length of the charge transfer time interval. For the fixed length of the charge transfer time interval, the amount of voltage increase (or decrease in the case of discharging) corresponds to the oscillation phase value change (phase error) between two adjacent events of sampling. The phase value change of the oscillator signal (at the instant of turning the oscillation OFF) will produce change in the charge stored on the charge holding capacitor 404, which will result in the correction of the phase of the oscillator signal due to negative feedback mechanism via the frequency control signal 268. Thus, sampling phase feedback mechanism is achieved, stabilizing the operating frequency of the oscillator, which does not require continuous-time operation of the oscillator. Referring now to FIG. 4, the stabilizing resistor 402, the charge holding capacitor 404, the resistor 406 and the capacitor 408 form preferred configuration of the loop filter for the sampling phase-locked loop of the invention. In the preferred embodiment, frequency acquisition of the phase-locked loop is ensured by the proper design of the loop (for adequate capture and tracking ranges), thus the phase lock is achieved without the need for an extra aided acquisition circuitry. Design procedures and constraints are well known to those having skill in the art and need not to be described further herein. However, it is understood that the length of the charge transfer time interval could be varied (swept) for several charge transfer cycles, if the design constraints do not allow for sufficient capture and tracking ranges, and aided acquisition is necessary. In such embodiment, the length of the charge transfer time interval is varied (swept) with the rate of change in time smaller then the value of square of the natural loop frequency (preferably less then half of that value). Embodiment employing such aided acquisition method is still considered being within the scope of this invention.

The super-regenerative receiver, according to the invention, can also be utilized to receive frequency hopping spread spectrum signal. Required jumps in receive frequency can be achieved by changing the length of the charge transfer time interval periodically, thus changing the receiver's operating frequency, accordingly to the pseudo-random sequence of frequencies (as imposed by such spread spectrum system). It is also understood that jumps in frequency could be achieved by changing the frequency of the quench signal 264 (within certain limited range), or by both described here methods simultaneously, and any of the mentioned method(s) and their combination(s) shall not narrow the scope of the invention. It is still understood that the super-regenerative receiver, according to the invention, can be utilized to receive direct sequence spread spectrum signal. In such embodiment, the quench signal 264 is phase modulated accordingly to the pseudo-random sequence in order to de-spread, thus to de-modulate, the direct sequence spread spectrum signal being received. Parameters of the de-spreading sequence are imposed by such direct sequence spread spectrum system. Embodiment employing such de-spreading method is still considered being within the scope of the invention. Those and other methods, including those being combination(s) of methods described here, shall not narrow the scope of this invention. Accordingly, the scope of the invention should not be determined by the embodiment(s) illustrated, but by the appended claims and their legal equivalents.

Referring now to FIG. 5, the crystal oscillator 500 generates the clock signal 262, which serves as a high stability master clock for all other control signals. The quench signal 264 is derived from the clock signal 262 by dividing its frequency down, using the frequency divider 502 (fixed division ratio digital frequency divider in the preferred embodiment). The clock and logic control 214 also produces the charge transfer enable signal 266. The length of the charge transfer time interval (time while the charge transfer enable signal 266 is in the logic state HIGH) is an integer multiple of the period of the clock signal 262 (thus, the frequency of the clock signal 262 defines the time resolution). For each of the receiver's operating channel frequencies, corresponding integer values are stored in the ROM (Read-Only Memory) look-up table (of the channel selection logic control 508). The inverted logic type load enable input of the charge transfer time digital counter 510 is activated by the inverted quench signal 554. Thus during the time when the quench signal 264 is in the logic state HIGH, the integer value (corresponding to channel currently selected by the user) is loaded to the charge transfer time digital counter 510 (in the preferred embodiment, via parallel bus of the transfer time value programming signals 550). The inverted logic type count enable input of the charge transfer time digital counter 510 is activated by the transfer time counter's count enable signal 552 (produced by the logic NAND gate 506). The logic NAND gate 506 is responsive to the inverted quench signal 554 and to inverted stand-by time signal 560, which is produced by a stand-by time R-S latch 512. The stand-by time R-S latch 512 is of the asynchronous (static) latch type, having both clear and preset inputs of the inverted logic type (each of the inputs is activated by the logic state LOW). Upon transition of the quench signal 264 from logic state HIGH to logic state LOW (and when the inverted quench signal 554 and the inverted stand-by time signal 560 are both in logic state HIGH), the charge transfer time digital counter 510 is enabled to count down (from the currently programmed value down to zero). The logic NOR gate 514 is responsive to the stand-by time signal 558 (produces by Q output of the stand-by time R-S latch 512) and to the quench signal 264 to produce the charge transfer enable signal 266. Since the quench signal 264 and the stand-by time signal 558 are now both in logic state LOW, the charge transfer enable signal 266 is in the logic state HIGH. Upon reaching the value of zero (while counting down), the charge transfer time digital counter 510 generates inverted logic mono-pulse (the transfer time counter's output signal 556), being the carry impulse of the counter. The transfer time counter's output signal 556 is used to preset the stand-by time R-S latch 512. As a result, the stand-by time signal 558 is now in the logic state HIGH and the charge transfer enable signal 266 is now in the logic state LOW. Accordingly, the inverted stand-by time signal 560 is now in the logic state LOW, thus the charge transfer time digital counter 510 stops counting. The charge transfer time ends and the receiver is in its stand-by mode until the stand-by time R-S latch 512 is cleared. Upon transition of the inverted quench signal 554 from logic state HIGH to logic state LOW, stand-by time R-S latch 512 is cleared and the integer value (corresponding to the receiver's operating channel frequency currently selected by the user) is loaded from the ROM memory to the charge transfer time digital counter 510, thus preparing the counter for the next cycle of counting down. The design of the individual components described above is well known to those having skill in the art and need not to be described further herein.

Referring now to FIG. 7, the amplitude control signal 260 switches between two voltage levels corresponding to logic state LOW (when receiving weak RF input signal) and logic state HIGH (when receiving strong RF input signal). For the strong (high amplitude level) input RF signal, the delay time circuitry produces longer delay time interval then for the input RF signal having low amplitude, thus (referring now to FIG. 2) the pulse width of the train of pulses of the power detection signal 258 and the voltage of the amplitude demodulated output signal 272 are kept within the limited range. Referring now to FIG. 7, when the amplitude control signal 260 is in its LOW state, the digital multiplexer 704 connects short delay value programming signals 750 to programming inputs of the delay time digital counter 706 (via lines of the delay value programming signals 754). Thus, the value stored in a short delay value programming device 700 is loaded into the delay time digital counter 706 (in the preferred embodiment, delay value is loaded to the counter via parallel bus). When the amplitude control signal 260 is in its HIGH state, the digital multiplexer 704 connects long delay value programming signals 752 to the programming inputs of the delay time digital counter 706 (via the lines of the delay value programming signals 754). Thus, the value stored in a long delay value programming device 702 is loaded into the delay time digital counter 706 (in the preferred embodiment, delay value is loaded to the counter via parallel bus). The inverted logic type load enable input of the delay time digital counter 706 is activated by the quench signal 264 (value is loaded while the quench signal 264 is in logic state LOW). At the same time, the quench signal 264 is used to clear the receiving time R-S latch 710. When the quench signal 264 and the receiving time inverted signal 762 are both in logic state HIGH, the delay time digital counter 706 is enabled to count down (from the programmed value down to zero). Upon reaching the value of zero (while counting down), the delay time digital counter 706 generates inverted logic mono-pulse (delay time counter's output signal 758), being the carry impulse of the counter. The delay time counter's output signal 758 is used to preset the receiving time R-S latch 710 and the ramping time R-S latch 716. Thus, the receiving time inverted signal 762 is now in logic state LOW and the delay time digital counter 706 stops counting—delay time ends. Because the bias ramping capacitor 724 is discharged, during the delay time the bias ramping signal 352 is equal (or about) zero volts and (referring now to FIG. 3) the negative resistance circuit 304 is placed in stand-by mode (while the analog switch 302 and the analog switch 306 are both turned ON). Referring now to FIG. 9A, during the delay time, small transient oscillation appears in the waveform of the resonator's current, caused by switching transient and the charge left on the resonator from the previous discharge cycle. Therefore, the length of the delay time interval is chosen to allow for complete decay of the transient oscillation, in order to ensure the same starting condition for each cycle of the quenched oscillation amplitude build-up. Referring now to FIG. 7, the inverted logic type load enable input of the bias ramping time digital counter 714 is activated by the receiving time signal 760 (produced by Q output of the receiving time R-S latch 710). Thus, during the time when the receiving time signal 760 is in the logic state LOW, the value stored in a bias ramping value programming device 712 is loaded into the bias ramping time digital counter 714 (in the preferred embodiment, via parallel bus of the ramping time value programming signals 764). The inverted logic type count enable input of the bias ramping time digital counter 714 is activated by the inverted bias ramping enable signal 770 (produced by the ramping time R-S latch 716). When the delay time ended, the ramping time R-S latch 716 has been preset. Thus, the inverted bias ramping enable signal 770 is now in logic state LOW and the bias ramping time digital counter 714 is enabled to count down (from the programmed value down to zero)—ramping time starts. The analog switch 718 is responsive to the bias ramping enable signal 768. The bias ramping enable signal 768 is produces by Q output of the ramping time R-S latch 716. When the bias ramping enable signal 768 is in logic state HIGH (during ramping time), the analog switch 718 connects the supply voltage 350 to the bias ramping capacitor 724 via the bias ramping resistor 720. While the bias ramping capacitor 724 is being charged, the voltage across the bias ramping capacitor 724 is raising, thus producing the bias ramping signal 352. Upon reaching value of zero (while counting down), the bias ramping time digital counter 714 generates inverted logic mono-pulse (the ramping time counter's output signal 766), being the carry impulse of the counter. The ramping time counter's output signal 766 is used to clear the ramping time R-S latch 716. The analog switch 722 is responsive to the inverted bias ramping enable signal 770 (produced by the ramping time R-S latch 716). The analog switch 722 is connected parallel to the bias ramping capacitor 724, thus discharging the bias ramping capacitor 724 when the inverted bias ramping enable signal 770 is in logic state HIGH (to prepare the bias ramping capacitor 724 for the next charging cycle). The length of the ramping time interval and the shape of the bias ramping signal 352 are chosen to optimize sensitivity of the super-regenerative receiver according to the invention. It is however understood, that other embodiments are possible, for example the embodiment using constant current source to charge the bias ramping capacitor 724. Such embodiment is considered being within the scope of the invention. Accordingly, the scope of the invention should not be determined by the embodiment(s) illustrated, but by the appended claims and their legal equivalents. The design of the individual components described above is well known to those having skill in the art and need not to be described further herein.

Sampling phase feedback mechanism, according to the invention (stabilizing the operating frequency of the oscillator), does not require continuous-time operation of the oscillator. Method of achieving frequency stability, according to the invention, utilizes components which are already building blocks of the typical, conventional, super-regenerative receiver. Thus, the phase-locked loop circuit, according to the invention, does not unduly increase the cost and complexity of the super-regenerative receiver. Sampling phase-locked loop circuit, described here, does not require additional frequency divider, thus the power consumption is kept minimal for higher operating frequencies, such as microwaves.

While the description above contains many specificities, these should not be construed as limitations on the scope of the invention, but as merely providing examples of some of the presently preferred embodiments of the invention. Thus, the scope of the invention should be determined by the appended claims and their legal equivalents, rather then by the embodiment(s) illustrated.

What I claim as my invention is:

1. A super-regenerative receiver comprising, in combination:

means for transferring charge that produces a frequency control signal related to an instantaneous phase of an oscillation signal generated by a quenched oscillator at an instant of turning said oscillation signal OFF; and said quenched oscillator, periodically generating bursts of said oscillation signal, that is responsive to said frequency control signal, to adjust frequency of said oscillation signal, and to a received signal injected into it; wherein said quenched oscillator further comprises:

an electronically tunable resonator responsive to said frequency control signal; and an oscillator active circuit periodically producing a negative resistance for said electronically tunable resonator in order to compensate losses in the resonator, thus to produce said oscillation signal.

2. A super-regenerative receiver according to claim 1 wherein said means for transferring charge further comprises:

a charge holding capacitor; and an analog switch periodically connecting said charge holding capacitor to said electronically tunable resonator in order to transfer the charge.

3. A method for demodulation of a received signal which bears spread spectrum modulation by using a super-regenerative receiver, comprising the steps of:

generating an oscillation signal quenched by a quenching signal of said super-regenerative receiver, wherein said super-regenerative receiver includes a sampling phase-locked loop;

transferring charge for the duration of a charge transfer time between an electronically tunable resonator of said super-regenerative receiver and charge storage means of said super-regenerative receiver to produce a frequency control signal for said sampling phase-locked loop;

adjusting the phase of said oscillation signal by aid of said sampling phase-locked loop;

selecting the frequency of said quenching signal, wherein an integer multiple of the frequency of said quenching signal is equal to, or almost equal to, the frequency of said received signal; and selecting the duration of said charge transfer time according to the received channel frequency selection.

4. The method according to claim 3 wherein the duration of said charge transfer time is selected according to pseudo-random sequence defined by a frequency hopping spread spectrum system.

5. The method according to claim 3 wherein the frequency of said quenching signal is periodically changing according to pseudo-random sequence defined by a frequency hopping spread spectrum system.

6. The method according to claim 3 wherein said quenching signal is phase modulated by pseudo-random sequence defined by a direct sequence spread spectrum system.

7. The method according to claim 3 wherein the frequency of said quenching signal, or the phase of said quenching signal, and the duration of said charge transfer time are simultaneously periodically modified according to pseudo-random sequence defined by a spread spectrum system.

* * * * *